US007067359B2

United States Patent
Wu

(10) Patent No.: US 7,067,359 B2
(45) Date of Patent: Jun. 27, 2006

(54) METHOD OF FABRICATING AN ELECTRICAL FUSE FOR SILICON-ON-INSULATOR DEVICES

(75) Inventor: Chi-Hsi Wu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 61 days.

(21) Appl. No.: 10/811,405

(22) Filed: Mar. 26, 2004

(65) Prior Publication Data

US 2005/0214982 A1    Sep. 29, 2005

(51) Int. Cl.
*H01L 21/82* (2006.01)
*H01L 27/10* (2006.01)
(52) U.S. Cl. ............... 438/132; 438/149; 438/215; 438/311; 438/333; 438/601; 257/209; 257/347; 257/529
(58) Field of Classification Search ............... None
See application file for complete search history.

(56) References Cited

U.S. PATENT DOCUMENTS

| 6,100,116 | A  | * | 8/2000 | Lee et al. ............... 438/128 |
| 6,444,544 | B1 | * | 9/2002 | Hu et al. ............... 438/467 |
| 6,555,458 | B1 |   | 4/2003 | Yu ............... 438/601 |
| 6,753,210 | B1 | * | 6/2004 | Jeng et al. ............... 438/132 |
| 6,911,360 | B1 | * | 6/2005 | Li et al. ............... 438/238 |
| 6,933,591 | B1 | * | 8/2005 | Sidhu et al. ............... 257/665 |

FOREIGN PATENT DOCUMENTS

JP    61154024 A  *  7/1986

* cited by examiner

*Primary Examiner*—Alonzo Chambliss
(74) *Attorney, Agent, or Firm*—Slater & Matsil, L.L.P.

(57) ABSTRACT

A method and apparatus for providing an electrical fuse is provided. An electrical fuse is patterned from the active layer of a semiconductor-on-insulator (SOI) wafer. One shape of the electrical fuse may be a first and second portion electrically coupled via a third section. The third section is typically thinner than the first and second portion. An ion implant is performed to fully deplete the electrical fuse, and a silicidation process is performed. Thereafter, standard processing techniques may be used to form vias and other integrated circuit structures.

12 Claims, 4 Drawing Sheets

METHOD OF FABRICATING AN ELECTRICAL FUSE FOR SILICON-ON-INSULATOR DEVICES

TECHNICAL FIELD

The present invention relates to semiconductor devices and, in particular, to an electrical fuse for silicon-on-insulator devices.

BACKGROUND

Fuses are commonly used in integrated circuits to provide redundancy and programming capabilities. To increase yield in integrated circuits such as memory chips, it is common to include redundant memory cells on the memory chips. If a memory circuit is found to be defective or is not needed, the fuse may be blown by activating or deactivating the redundant memory cells. Another common practice is to utilize fuses to program or customize integrated circuits for a particular application or customer. In this manner, the same chip may be produced and customized for individual customers by programming the fuses after fabrication, thereby reducing the fabrication costs.

Typically, fuses comprise a conductive link that may be blown or ruptured to prevent current from flowing. The conductive link is typically formed of a metal, such as aluminum or copper, and blown by a laser. The use of the laser, however, requires complicated processing steps and expensive laser equipment.

Another type of fuse involves the use of an electrical fuse. Generally, an electrical fuse comprises two endpoints or contact pads connected with a thinner link, referred to as a fuse link. The electrical fuse is formed from a layer of polysilicon that has been deposited on a silicon substrate and silicided. In operation, the smaller dimensions of the fuse link causes high current concentrations or "current crowding" where the dimensions of the fuse are reduced in the fuse link. To program or "blow" the fuse, an electrical current of sufficient magnitude is passed through the fuse link for a sufficient period of time to cause silicide agglomeration or melting of the fuse link, thereby increasing the resistance of the link. A sensing circuit is then able to sense the amount of resistance to determine the state of the fuse.

In recent years, silicon-on-insulator (SOI) substrates have been investigated for use in semiconductor processing. As the use of SOI substrates increases, it is necessary to develop new process steps and devices to incorporate aspects of the SOI substrates. In particular, new processes are needed to incorporate the use and fabrication of an electrical fuse into existing SOI fabrication processes. For the processes to be effective and useful, the processes should be integrated with existing processes, adding no or few additional process steps.

BRIEF SUMMARY OF THE INVENTION

These and other problems are generally solved or circumvented, and technical advantages are generally achieved, by preferred embodiments of the present invention which provides an electrical fuse for silicon-on-insulator devices.

In accordance with a preferred embodiment of the present invention, a method for fabricating an electrical fuse on an SOI substrate is provided. The active layer of the SOI substrate is patterned such that an electrical fuse is formed. The surface of the active layer is silicided.

In accordance with another preferred embodiment of the present invention, a method of forming a semiconductor device is provided. The method includes providing an SOI substrate having an active layer formed on an insulator layer. A source/drain region of a transistor and an electrical fuse are simultaneously patterned in the active layer. A gate electrode is formed over the source/drain regions and lightly-doped drains are formed. An ion implant process is performed to dope the electrical fuse and the source/drain region.

In accordance with yet another embodiment of the present invention, an electrical fuse formed on an SOI wafer is provided. The electrical fuse has a first section and a second section interconnected by a third section. The first, second, and third sections are formed from the active layer of the SOI wafer. The surface of the electrical fuse may be silicided.

In accordance with yet still another embodiment of the present invention, a semiconductor device is provided. The semiconductor device comprises a source/drain region of a transistor and an electrical fuse formed in an active layer of an SOI.

An advantage of the present invention is that it provides an electrical fuse formed from the active layer of an SOI wafer. The fabrication of the electrical fuse may be incorporated into standard processing techniques for SOI wafers and adds no or few additional process steps. Thus, the present invention provides an efficient and cost effective manner of providing an electrical fuse on an SOI wafer.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The above features of the present invention will be more clearly understood from consideration of the following descriptions in connection with the accompanying drawings in which.

DETAILED DESCRIPTION OF PREFERRED EMBODIMENTS

Figure 1:
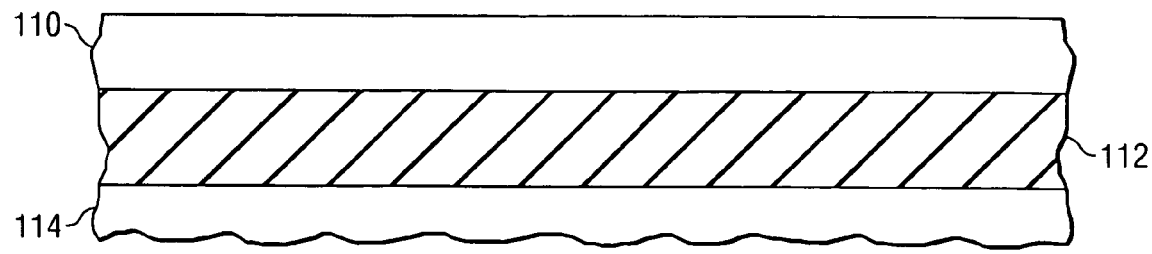
FIGS. 1, 2a, 2b, 3a, 3b, 4a, 4b, 5a, 5b, 6a, 6b, 7a, and 7b are cross-section side views illustrating various steps of fabricating an electrical fuse in accordance with one embodiment of the present invention.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Referring now to the drawings, wherein like reference numerals are used herein to designate like elements throughout the various views, preferred embodiments of the present invention are illustrated and described. As will be understood by one of ordinary skill in the art, the figures are not necessarily drawn to scale, and in some instances the drawings have been exaggerated and/or simplified in places for illustrative purposes only. One of ordinary skill in the art will appreciate the many applications and variations of the present invention in light of the following description for preferred embodiments of the present invention. The preferred embodiments discussed herein are just a few illustrative examples of the present invention and do not necessarily limit the scope of the invention to the preferred embodiments described.

In the discussion that follows, a method of forming an electrical fuse on an SOI substrate is provided. The method is integrated with known process steps to fabricate a transistor such that the electrical fuse and a transistor are formed simultaneously. It should be noted that the formation of the electrical fuse does not require additional process steps. Rather, the masks are altered such that the electrical fuse and the transistor may be formed simultaneously without additional process steps. It should also be noted, however, that a transistor is used for illustrative purposes only and that embodiments of the present invention may be used to fabricate an electrical fuse simultaneously with other semiconductor devices with no or few additional process steps. For example, embodiments of the present invention may be used to fabricate an electrical fuse simultaneously as fin-field effect transistors (FinFETs), capacitors, and the like.

Referring now to FIG. 1, a cross-section view is shown of an SOI wafer 100. Generally, SOI substrates, such as SOI wafer 100, have an active layer 110, an insulator layer 112, and a substrate 114. The active layer 110, generally formed of a thin epitaxial layer of silicon, silicon-germanium oxide, germanium, strained silicon, or the like, is disposed on the insulator layer 112. The insulator layer 112, often referred to as a buried oxide (BOX) layer, is provided on the substrate 114, which is typically a silicon or glass substrate. The insulator layer 112 is comprised of an insulator such as silicon dioxide, which electrically isolates the active layer 110 from the substrate 114.

Figure 2A:
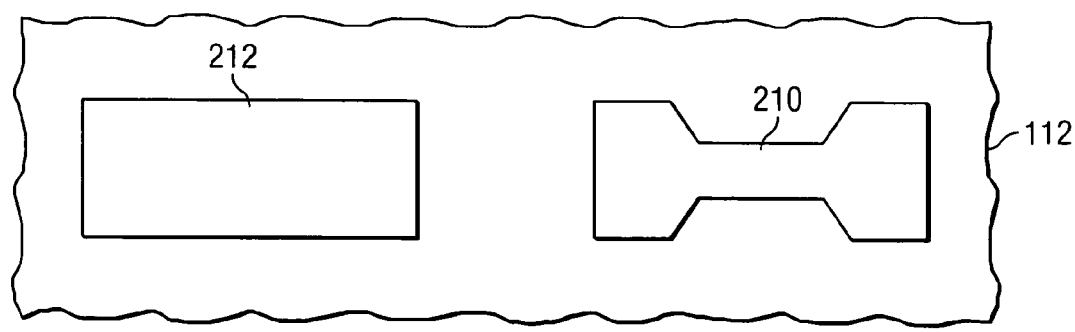
Figure 2B:
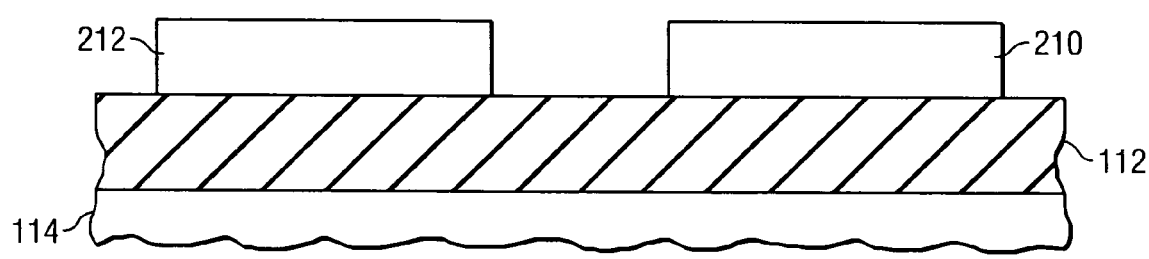

FIGS. 2a–2b show a plan view and a side view, respectively, of SOI wafer 100 after an electrical fuse 210 and the source/drain regions 212 of a transistor have been patterned from the active layer 110 of the SOI wafer 100. Generally, the electrical fuse 210 comprises larger areas connected by a thinner fuse link. In operation, as current flows through the fuse link, the current will cause silicide agglomeration or melting of the link, thereby increasing the resistance of the link and "blowing" the fuse.

The electrical fuse 210 and the source-drain regions 212 may be patterned and etched by standard photolithography and etching techniques as are known in the art. For example, the active layer 110 (FIG. 1) may be patterned by applying, exposing, and developing a photoresist material. Thereafter, the active layer 110 may be etched to form the electrical fuse 210 and source/drain regions 212 by performing a dry etch known in the art.

It should be appreciated that the process described above provides the simultaneous patterning and etching of the source/drain regions 212 and electrical fuse 210. In particular, the preferred embodiment provides a single mask that defines both the source/drain regions 212 and the electrical fuse 210. Therefore, a single etching process is used to simultaneously form the source/drain regions 212 and the electrical fuse 210. In this manner, no additional process steps are required to form both the source/drain regions 212 and the electrical fuse 210.

Figure 3A:
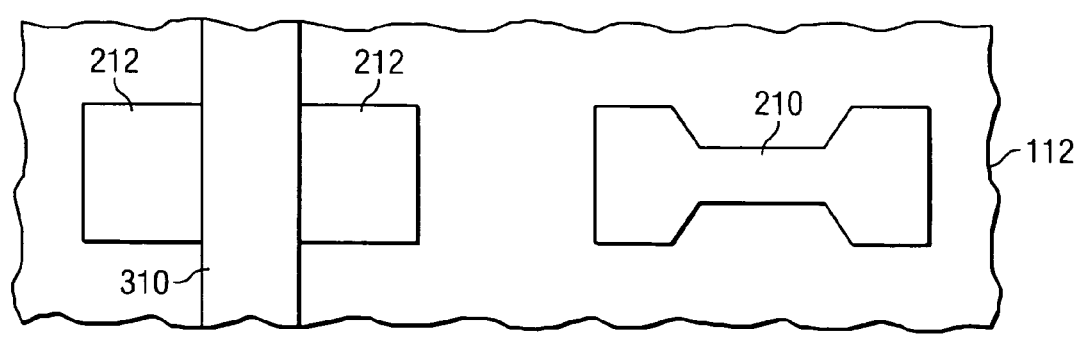
Figure 3B:
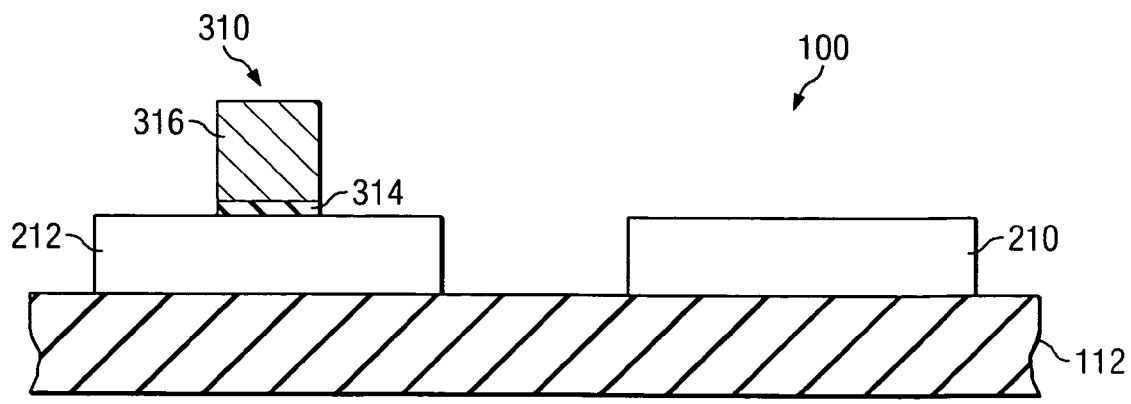

FIGS. 3a–3b show a plan view and a side view, respectively, of SOI wafer 100 after a gate electrode 310 has been formed. The gate electrode 310 generally comprises a dielectric layer 314 and a conductive layer 316. The dielectric layer 314, which prevents electron depletion, is preferably an oxide layer formed by an oxidation process, such as wet or dry thermal oxidation in an ambient comprising an oxide, $H_2O$, NO, or a combination thereof, or by chemical vapor deposition (CVD) techniques using tetra-ethyl-ortho-silicate (TEOS) and oxygen as a precursor. In the preferred embodiment, the dielectric layer is about 8 Å to about 100 Å in thickness, but more preferably about 16 Å in thickness.

The conductive layer 316 is generally a semiconductor material such as polysilicon, amorphous silicon, or the like. In the preferred embodiment, polysilicon is deposited undoped by low-pressure chemical vapor deposition (LPCVD) to a thickness in the range of about 500 Å to about 3000 Å, but more preferably about 1200 Å. Other conductive materials, such as metals, silicides, and the like, may be used for the conductive layer 316.

Figure 4A:
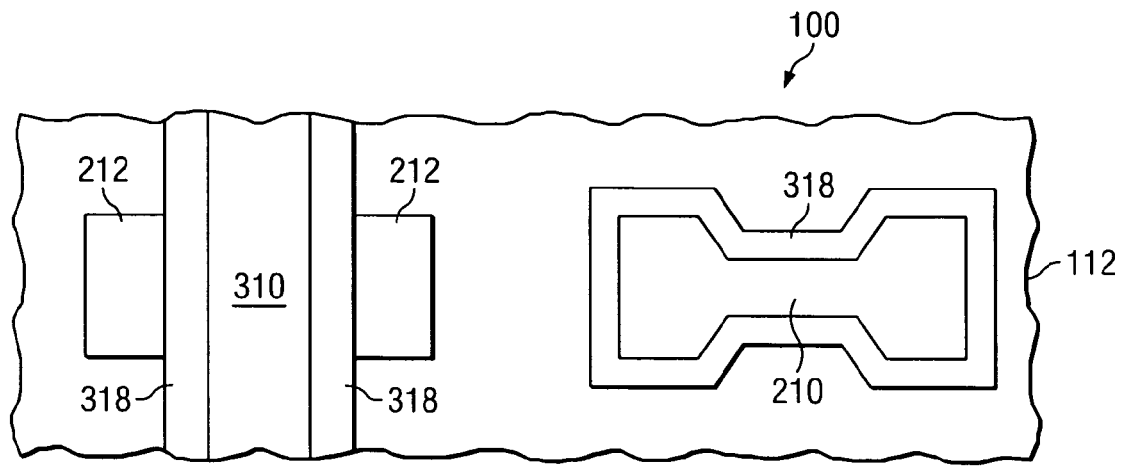
Figure 4B:
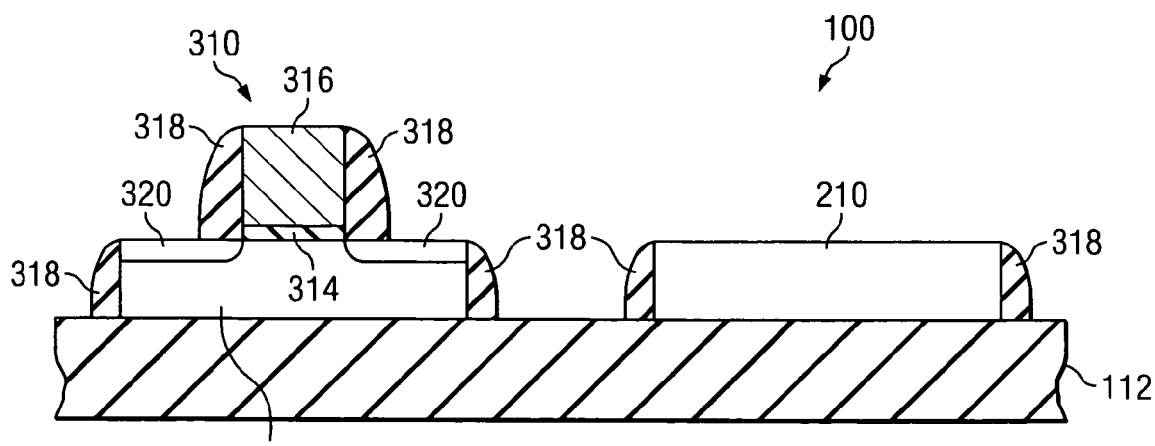

FIGS. 4a–4b show a plan view and a side view, respectively, of SOI wafer 100 of FIGS. 3a–3b after spacers 318 have been formed. After the gate electrode 310 has been formed and prior to forming the spacers 318, it is preferred that the source/drain region 212 be lightly doped, creating lightly doped drains (LDD) 320 (may also be referred to as source/drain extensions in recent sub-micro technologies). The LDD 320 may be doped with, for example, phosphorous ions at a dose of about 1E13 to about 1E16 atoms/$cm^2$ and at an energy of about 1 KeV to about 200 KeV to form an NMOS device. Alternatively, the LDD 320 may be doped using nitrogen, arsenic, antimony, or the like. To form a PMOS device, the LDD 320 may be doped with a p-type dopant such as boron, aluminum, gallium, indium, or the like. It should be noted that the electrical fuse 210 will also become lightly doped. However, the electrical fuse 210 will be doped heavier as discussed below with reference to FIGS. 5a–5b.

Optionally, a pocket or halo implant may be performed prior to forming the LDD 320. Halo implants are typically formed by implanting impurities at an oblique angle to the surface of the substrate such that the impurities are implanted below portions of the gate electrode. The halo implants generally comprise impurities of a connectivity type opposite the connectivity type of the LDD 320. For example, if the LDD 320 are formed with n-type impurities, p-type impurities are used to form the halo implants. In the embodiment discussed above in which an NMOS transistor is being formed, halo implants may be formed by implanting boron ions, or other p-type impurities, at a dose of about 1E13 to about 1E15 atoms/$cm^2$ and at an energy of about 5 KeV to about 200 KeV.

In a preferred embodiment, the spacers 318 are formed from a layer comprising $Si_3N_4$ that has been deposited using chemical vapor deposition (CVD) techniques using silane and ammonia as precursor gases, and deposition temperatures ranging from 250° to 900° C., to a thickness of about 200 Å to about 1200 Å, but more preferably about 600 Å. The spacer 318 may be patterned by performing an anisotropic etch process using a dry etch technology wherein the insulator layer 112 acts as a mask layer. In a preferred embodiment, however, an oxide layer (not shown) is formed below the Si$_3$N$_4$ as is known in the art. The oxide layer then acts as an etch stop layer during the formation of the spacer 318.

Figure 5A:
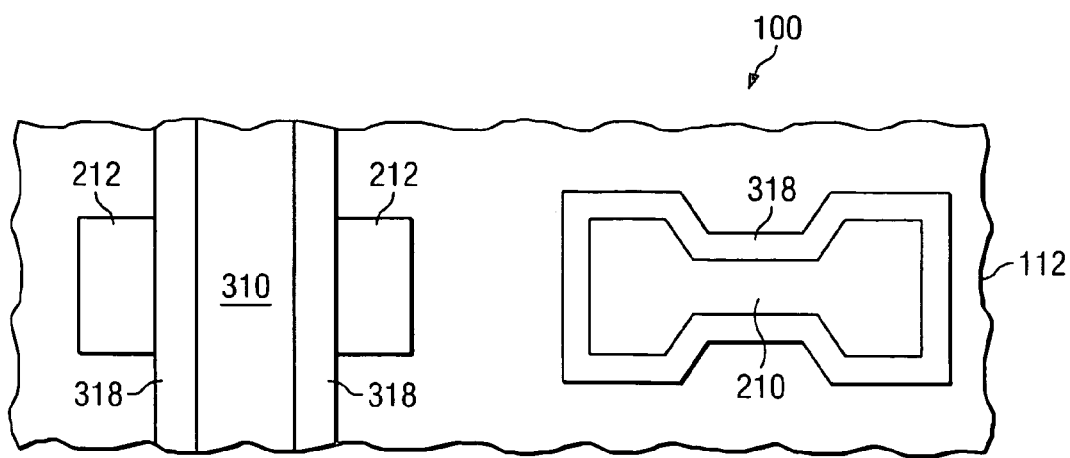
Figure 5B:
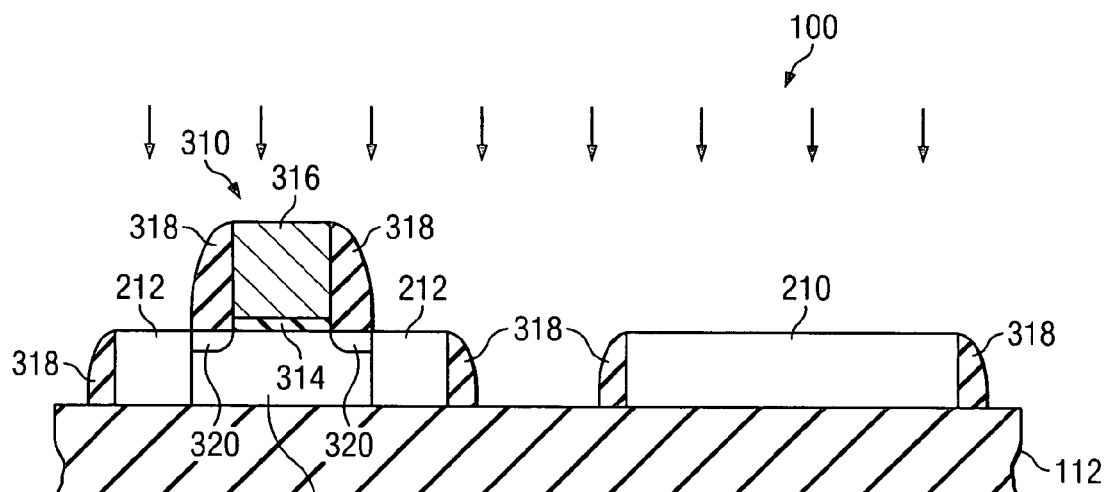

FIGS. 5a–5b show a plan view and a side view, respectively, of the SOI wafer 100 of FIGS. 4a and 4b after an ion implant has been performed. As illustrated in FIG. 5b, the exposed portions of the source/drain region 212 and the electrical fuse are doped. Preferably, the ion implant is performed such that the exposed portions of the source/drain region 212 and the electrical fuse are fully depleted. In one embodiment, the ion implant may be performed, for example, by implanting phosphorous ions at a dose of about 1E15 to about 1E16 atoms/cm$^2$ and at an energy of about 2 KeV to about 200 KeV to form an NMOS device. Alternatively, the polysilicon may be doped using nitrogen, arsenic, antimony, or the like, or may be doped with an p-type dopant such as boron, aluminum, gallium, indium, or the like to form a PMOS device.

It should be noted that the gate electrode 310 may be partially or fully depleted as a result of the ion implant process. If desired, a mask may be applied to the gate electrode 310 to prevent or restrict the amount of doping.

Figure 6A:
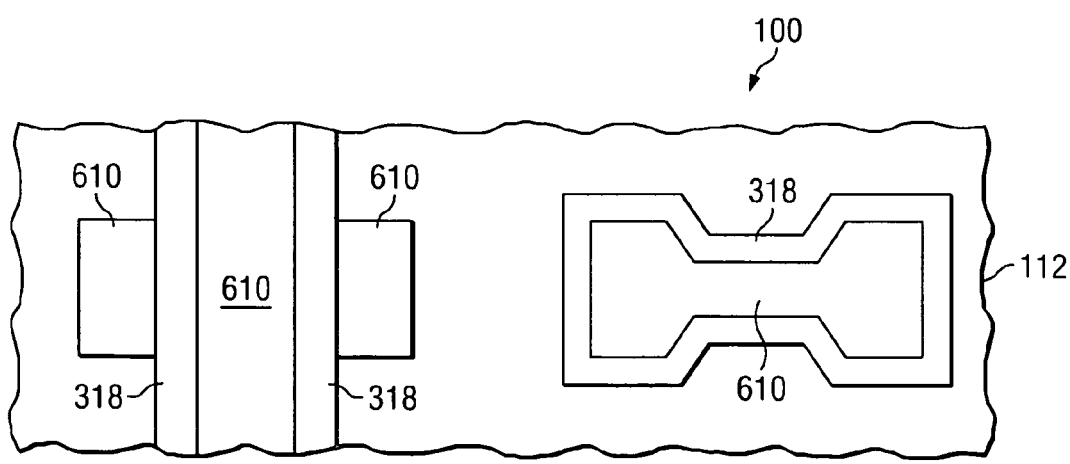
Figure 6B:
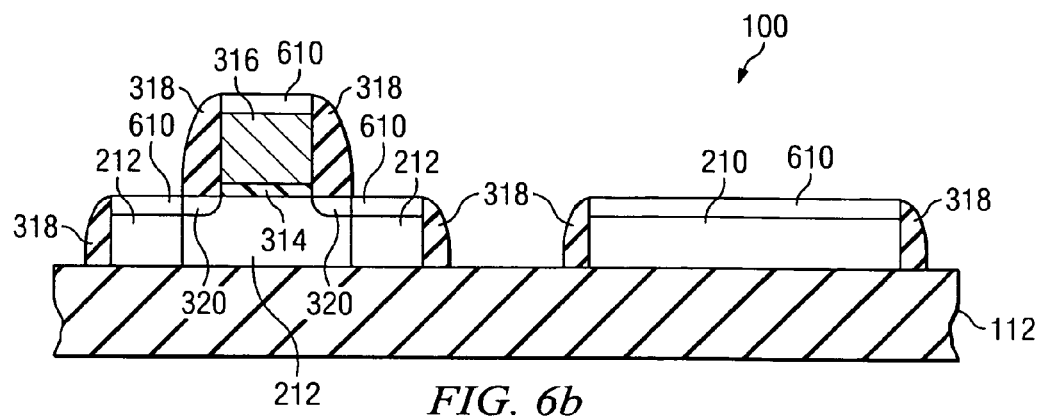

FIGS. 6a and 6b show a plan view and a side view, respectively, of the SOI wafer 100 of FIGS. 5a and 5b after the exposed surfaces of the gate electrode 310, the source/drain region 212, and the electrical fuse 210 have been silicided, creating silicided areas 610. The silicidation process may be performed, for example, by depositing a silicidation metal followed by an annealing process. In the preferred embodiment, the metal used for the silicidation is nickel. The metal may also be cobalt, copper, molybdenum, titanium, nickel, tantalum, tungsten, erbium, zirconium, platinum, combinations thereof, combinations thereof and nickel, or the like. The silicidation may be effected, for example, by a high temperature anneal with a temperature in the range of about 300° C. to about 700° C. The anneal can be performed in an inert ambient comprising nitrogen, helium, argon, neon, or other inert gases. The annealing time can range from about 5 seconds to about 200 seconds. For example, in the preferred embodiment in which nickel is used in the silicidation process and the amount of desired silicidation is about 30 to about 1000 Å in thickness, a high temperature anneal may be in the range of about 350° C. to about 900° C. for 30 seconds.

Figure 7A:
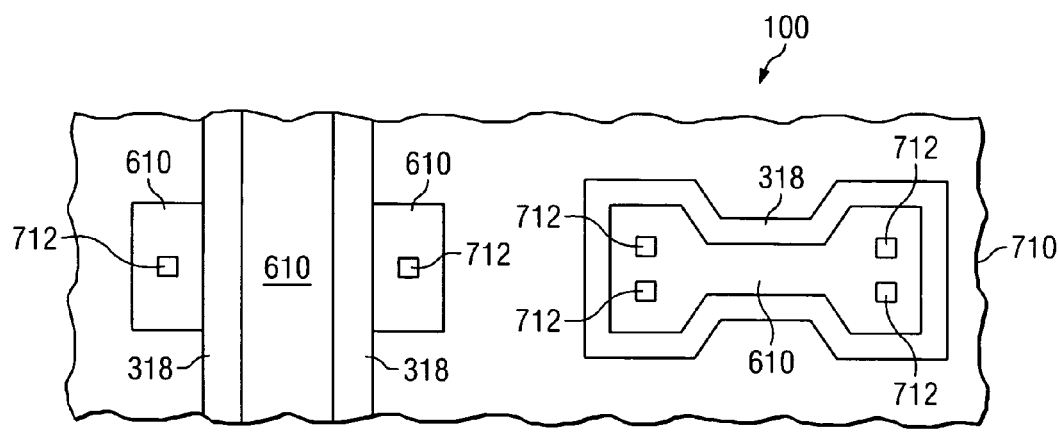
Figure 7B:
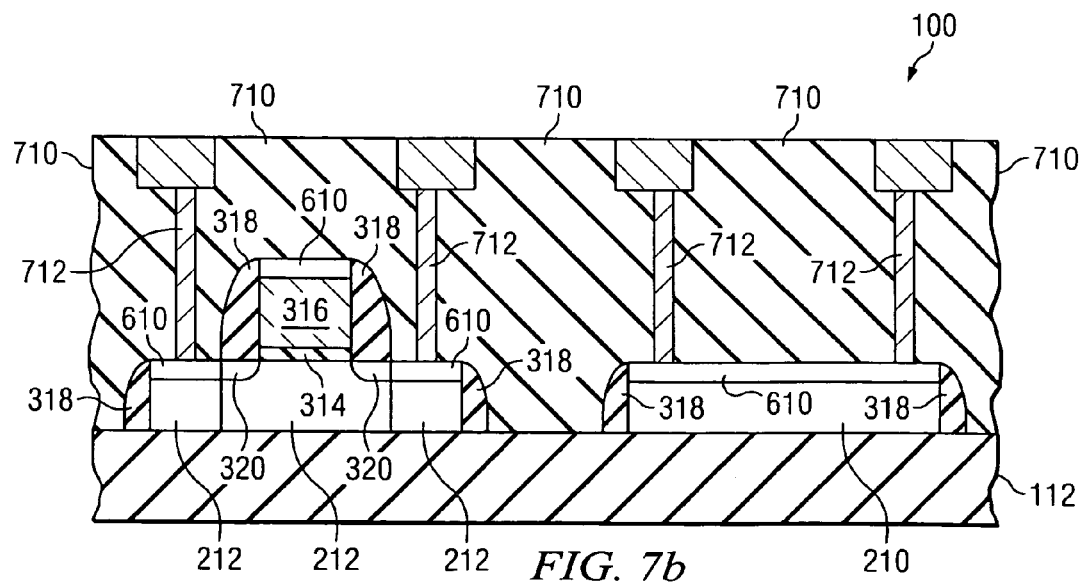

Thereafter, the SOI wafer may be prepared in accordance with other standard SOI processes. For example, FIGS. 7a and 7b illustrate the SOI wafer 100 of FIGS. 6a and 6b after an interlayer dielectric (ILD) 710 has been formed and vias 712 have been created to provide connectivity to the source/drain regions, the gate electrode, and the electric fuse contacts.

It should be appreciated that the preferred method described above allows an electrical fuse to be formed simultaneously with other semiconductor devices, such as transistors or the like, on an SOI substrate. Because the electrical fuse is formed simultaneously, no additional process steps are required, and an electrical fuse can be added to existing circuitry fabricated on an SOI substrate without additional costs. Thus, the method described above provides a cost effective method of adding electrical fuses to existing semiconductor circuitry on an SOI substrate.

It should be understood that the drawings and detailed description herein are to be regarded in an illustrative rather than a restrictive manner, and are not intended to limit the invention to the particular forms and examples disclosed. On the contrary, the invention includes any further modifications, changes, rearrangements, substitutions, alternatives, design choices, and embodiments apparent to those of ordinary skill in the art, without departing from the spirit and scope of this invention, as defined by the following claims. Thus, it is intended that the following claims be interpreted to embrace all such further modifications, changes, rearrangements, substitutions, alternatives, design choices, and embodiments.

What is claimed is:

1. A method of forming an electrical fuse, the method comprising the steps of:
   providing a semiconductor-on-insulator wafer having a first layer, an insulator layer, and an active layer;
   etching the active layer of a semiconductor-on-insulator wafer to form the electrical fuse;
   doping the electrical fuse; and
   siliciding the surface of the electrical fuse.

2. The method of claim 1, wherein the electrical fuse comprises a thin conductive strip between two wider conductive areas.

3. The method of claim 1, wherein the step of doping is performed such that the electrical fuse is fully depleted.

4. The method of claim 1, further comprising the step of forming a spacer around the circumference of the electrical fuse.

5. The method of claim 1, wherein the step of siliciding the surface of the electrical fuse is performed by depositing a metal and performing an anneal.

6. The method of claim 1, wherein the step of etching the active layer to form the electrical fuse includes etching the active layer to form a source/drain region of a transistor.

7. The method of claim 6, wherein the transistor is a FinFET.

8. A method of forming a semiconductor device, the method comprising the steps of:
   providing a substrate, the substrate having a first layer, an insulator layer formed on the first layer, and an active layer formed on the insulator layer;
   simultaneously forming a source/drain region of a transistor and an electrical fuse in the active layer;
   forming a gate electrode of the transistor on the source/drain region;
   forming lightly-doped drain regions in the source/drain region;
   forming spacers along the side of the gate electrode; and
   implanting exposed portions of the source/drain regions and the electrical fuse such that the exposed portions of the source/drain regions and the electrical fuse are substantially fully depleted.

9. The method of claim 8, further comprising the step of siliciding the surface of at least one of the gate electrode, source/drain region, and the electrical fuse.

10. The method of claim 8, wherein the electrical fuse comprises a thin conductive strip between two wider conductive areas.

11. The method of claim 8, further comprising siliciding a surface of the electrical fuse by depositing a metal and performing an anneal.

12. The method of claim 8, wherein the transistor is a FinFet.

* * * * *